United States Patent
Lee et al.

(10) Patent No.: US 6,440,800 B1
(45) Date of Patent: Aug. 27, 2002

(54) METHOD TO FORM A VERTICAL TRANSISTOR BY SELECTIVE EPITAXIAL GROWTH AND DELTA DOPED SILICON LAYERS

(75) Inventors: James Yong Meng Lee, Singapore (SG); Ying Keung Leung, Aberdeen (HK); Yelehanka Ramachandramurthy Pradeep; Jia Zhen Zheng, both of Singapore (SG); Lap Chan, San Francisco, CA (US); Elgin Quek, Singapore (SG); Ravi Sundaresan, San Jose, CA (US); Yang Pan, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 70 days.

(21) Appl. No.: 09/769,814

(22) Filed: Jan. 26, 2001

(51) Int. Cl.⁷ ............................................. H01L 21/336
(52) U.S. Cl. ...................................... 438/270; 438/268
(58) Field of Search ................................. 438/268, 270, 438/272

(56) References Cited

U.S. PATENT DOCUMENTS

| | | | |
|---|---|---|---|
| 4,982,266 A | 1/1991 | Chatterjee | 357/71 |
| 5,308,782 A | 5/1994 | Mazuré et al. | 437/52 |
| 5,545,586 A | 8/1996 | Koh | 437/89 |
| 5,780,327 A | 7/1998 | Chu et al. | 438/156 |
| 5,899,710 A | 5/1999 | Mukai | 438/156 |
| 6,001,678 A | 12/1999 | Takahashi | 438/238 |
| 6,174,763 B1 * | 1/2001 | Beilstein et al. | 438/238 |

* cited by examiner

Primary Examiner—Trung Dang
Assistant Examiner—William M. Brewster
(74) Attorney, Agent, or Firm—George O. Saile; Rosemary L. S. Pike; William J. Stoffel

(57) ABSTRACT

A method for a vertical transistor by selective epi deposition to form the conductive source, drain, and channel layers. The conductive source, drain, and channel layers are preferably formed by a selective epi process. Dielectric masks define the conductive layers and make areas to form vertical contacts to the conductive S/D and channel layers.

12 Claims, 4 Drawing Sheets

METHOD TO FORM A VERTICAL TRANSISTOR BY SELECTIVE EPITAXIAL GROWTH AND DELTA DOPED SILICON LAYERS

BACKGROUND OF INVENTION

1) Field of the Invention

This invention relates generally to fabrication of MOS transistors and more particularly to the fabrication of a vertical transistor by selective epitaxial growth and delta doped silicon layers.

2) Description of the Prior Art

Field effect transistors (FET's) are a fundamental building block in the field of integrated circuits. FET's can be classified into two basic structural types: horizontal and vertical. Horizontal, or lateral, FET's exhibit carrier flow from source to drain in a direction parallel (e.g. horizontal) to the plane of the substrate on which they are formed. Vertical FET's exhibit carrier flow from source to drain in a direction transverse to the plane of the substrate (e.g. vertical) on which they are formed.

While horizontal FET's are widely used and favored in the semiconductor industry because they lend themselves easily to integration, vertical FET's have a number of advantages over horizontal FET's. Because channel length for vertical FET's is not a function of the smallest feature size resolvable by state-of-the-art lithographic equipment and methods (e.g. on the order of 0.25 micrometers), vertical FET's can be made with a shorter channel length (e.g. on the order of 0.1 micrometers) than horizontal FET's, thus providing vertical FET's the capability to switch faster and as well as a higher power handling capacity than horizontal FET's. There is also the potential for greater packing density with vertical FET's.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,780,327 (Chu et al.) that shows a process for a vertical double gage FET with vertical contacts.

U.S. Pat. No. 6,001,678 (Takahashi) shows a vertical gate TX.

U.S. Pat. No. 5,545,586 (Koh) shows a Vertical TX using epitaxial layers. However, this reference differs from the invention.

U.S. Pat. No. 5,308,782 (Mazure et al.) shows a vertical TX stack using an etching involved process.

SUMMARY OF THE INVENTION

It is an object of the present invention to provide a method for fabricating a vertical transistor by selective epitaxial growth and delta doped silicon layers.

To accomplish the above objectives, the present invention provides a method of manufacturing a vertical transistor. The invention discloses a method for a vertical transistor by selective epi dep to form the conductive source drain and channel layers. The conductive source drain and channel layers are formed by a selective epi process. Dielectric masks define the conductive layers and make areas to form vertical contacts to the conductive S/D and channel layers.

The invention's method of fabrication of vertical transistor comprising the following steps.

A pad layer is formed over the substrate. Next, a first insulating layer is formed over a substrate. Next, we form a transistor opening through the pad layer and the first insulating layer. We form a first conductive layer over the substrate in the transistor opening. The first conductive layer has a first conductivity type. The first conductive layer is preferably formed by an epitaxial process. We form a first dielectric layer over portions of the first conductive layer and over the first insulating layer. We form a second conductive layer over the exposed portions of the first conductive layer. We form a second dielectric layer over portions of the second conductive layer and over the first insulating layer. Next, we form a third conductive layer over the exposed portions of the second conductive layer. The third conductive layer has a first conductivity type. We form a third dielectric layer over the second dielectric layer and the third conductive layer. A trench is formed through the third conductive layer the third, second and first conductive layers to at least expose the substrate. The first, second and third dielectric layers are shown as a merged dielectric layer. We next form a gate dielectric layer on the sidewalls and bottom of the trench. The gate dielectric layer is preferably comprised of silicon oxide. Then we form a gate over the gate dielectric layer and filling the trench. We form a cap dielectric layer over the merged dielectric layer. Contacts are formed through the first second and third dielectric layers (shown as layer) to contact the first, second and third conductive layers.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

A preferred embodiment of the invention is shown in FIGS. 1 through 8. Note that the compositions and fabrication processes described are illustrative examples, and the invention is not limited to the compositions and fabrication process. Comparable substitutions are possible as known to those skilled in the art.

Figure 1:
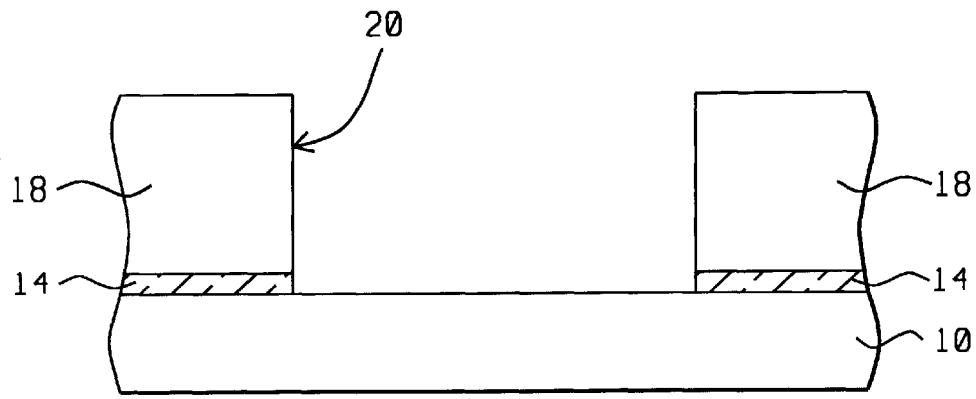
FIGS. 1 through 8 are cross sectional views for illustrating a method for manufacturing a vertical transistor according to the present invention.

As shown in FIG. 1, a pad layer 14 is formed over the substrate 10. The pad layer 14 is preferably comprised of silicon oxide.

Next, a first insulating layer 18 is formed over the substrate 10. The substrate can be, but is not limited to, a monocrystalline silicon wafer, silicon and insulator (SOI) or a silicon on sapphire (SOS). The first insulating layer 18 is preferably comprised of silicon nitride having a thickness of between about 1000 and 5000 Å.

Next, we form a transistor opening 20 through the pad layer 14 and the first insulating layer 18.

Figure 2:
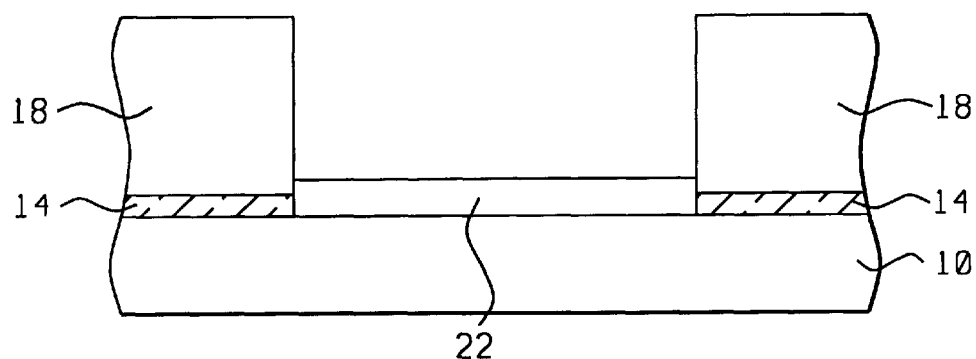

As shown in FIG. 2, we form a first conductive layer 22 over the substrate 10 in the transistor opening 20. The first conductive layer will act as a source/drain (S/D). The first conductive layer 22 has a first conductivity type. Preferably the first conductivity type is n type, but can be p-type to form the opposite by Transistor. The first conductive layer 22 is preferably formed by a selective epitaxial process. That is, the first conductive layer is only deposited on the exposed substrate 10 in the transistor opening 20. The first conductive layer preferably has dopant concentration between 1E19 and 1E21 atom/cm$^3$.

Figure 3:
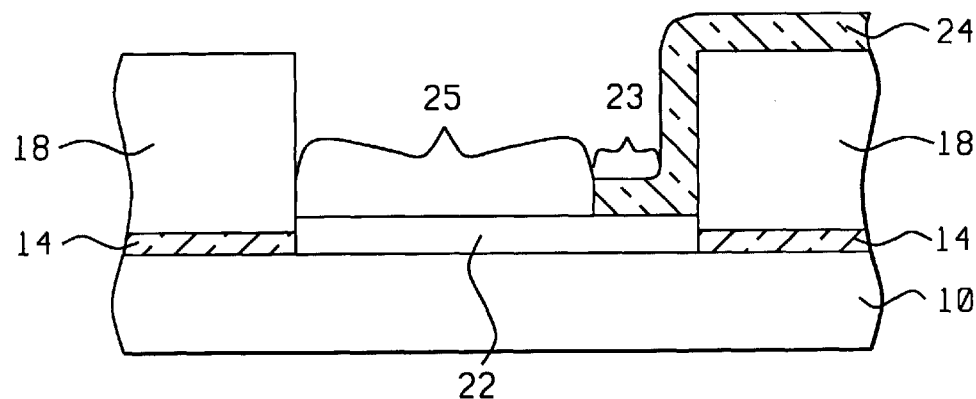

As shown in FIG. 3, we form a first dielectric layer over portions of the first conductive layer 22 and over the first insulating layer 18. The first dielectric layer is blanket deposited and patterned using a lithographic process. The first dielectric layer overlies a first contact area 23 over the first conductive layer. The exposed portions of the first conductive layer define a secondary area 25 where a second conductive layer will be formed. The first dielectric layer is preferably comprised of silicon oxide.

Figure 4:
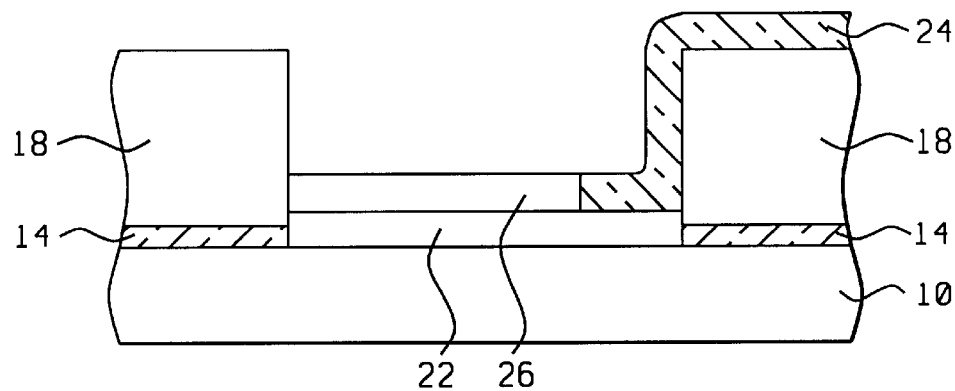

As shown in FIG. 4, we form a second conductive layer 26 over the exposed portions of the first conductive layer 22. The second conductive layer will act as a channel region. The second conductive layer 26 has a second conductivity type (opposite to the first conductivity type). The second conductive layer 26 formed by a selective epitaxial process and the second conductive layer 26 is comprised of silicon. The second conductive layer preferably has a p concentration between 1E16 and 4E18 Atoms/cm$^3$.

Figure 5:
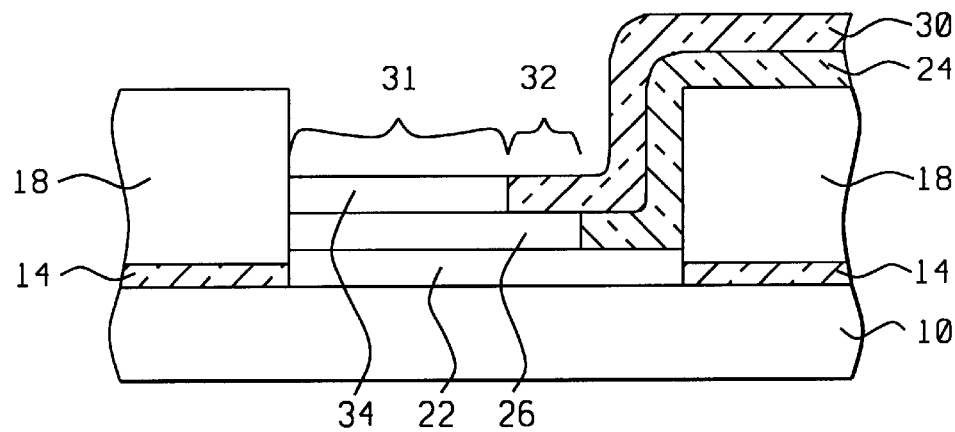

As shown in FIG. 5, we form a second dielectric layer 30 over portions of the second conductive layer 26 and over the first insulating layer 18. The second dielectric layer is blanket deposited and patterned using a lithographic process. The second dielectric covers a second contact area 32 over the second conductive layer. The second dielectric defines a tertiary area 31 were a third conductive layer will be formed.

The second dielectric layer 26 is preferably comprised of silicon oxide.

Next, we form a third conductive layer 34 over the exposed portions of the second conductive layer 26. The third conductive layer 34 will act as a source/drain (S/D) layer. The third conductive layer 34 has a first conductivity type.

Figure 6:
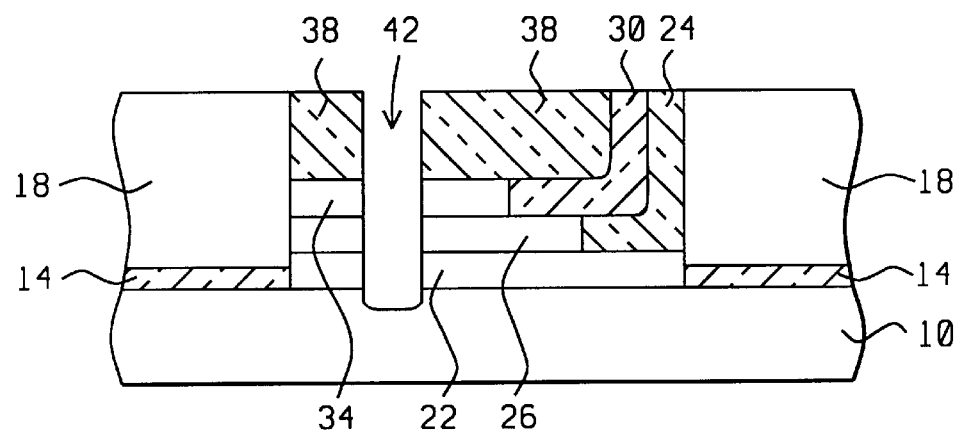
Figure 7:
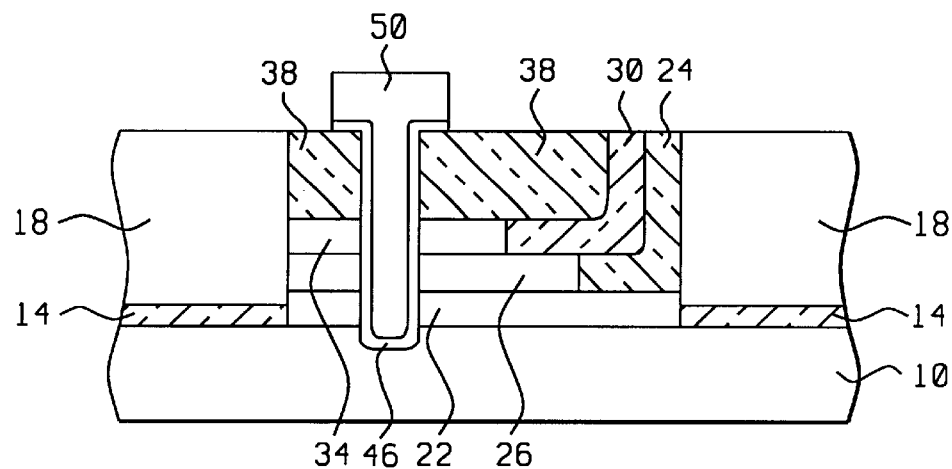

As shown in FIG. 6, we form a third dielectric layer (38) over the second dielectric layer 26 and the third conductive layer 34. The third dielectric layer is blanket deposited and preferably chemical-mechanical polished (CMP) to the level of the top surface of layer 18.

As shown in FIG. 6, we form a trench (e.g., gate trench) 42 through the third conductive layer 34, second 26 and first conductive 22 layers to at least expose the substrate 10. The trench 42 preferably has a width of between about 0.2 μm and 2.0 μm.

We next form a gate dielectric layer 46 on the sidewalls and bottom of the trench. The gate dielectric layer 46 is preferably comprised of silicon oxide.

Then we form a gate 50 over the gate dielectric layer 46 and filling the trench 42. The gate 50 is preferably comprised of polysilicon, Aluminum or tungsten (W) and most preferably polysilicon. The gate 50 is preferably formed by depositing a gate layer over filling the trench 42 and over the third, second and first dielectric layers and chemical-mechanical polishing (CMP) the gate material layer.

Figure 8:
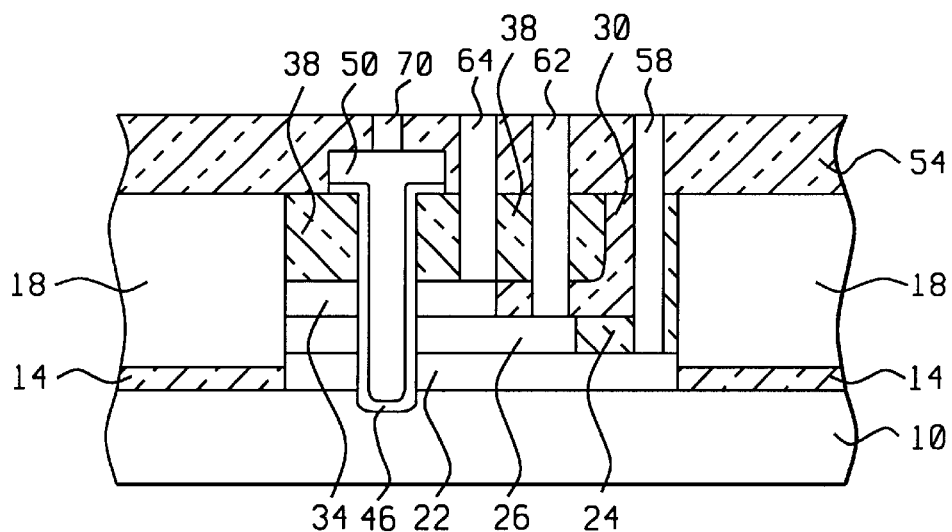

As shown in FIG. 8 we form a cap dielectric layer 54 over the dielectric layers 38 30 24. The cap dielectric layer is preferably comprised of SiO$_2$.

As shown in FIG. 8, we form contacts 58 62 64 70 through the cap dielectric layer 54, the first second and third dielectric layers to contact the first, second and third conductive layers and gate.

Figure 9:
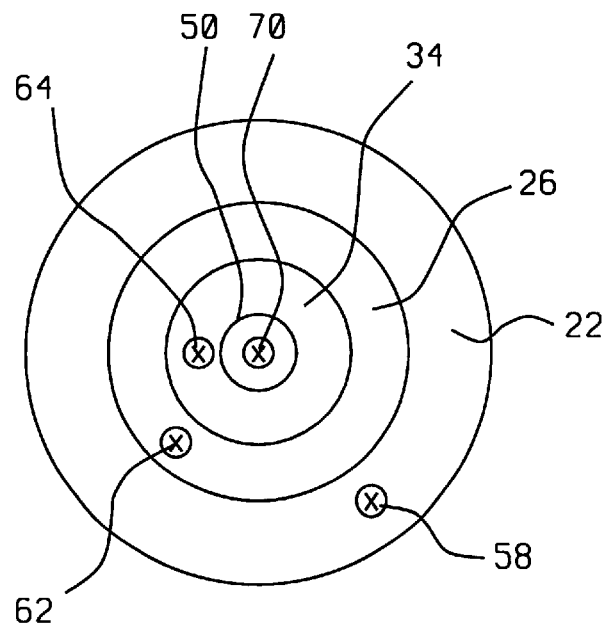
FIG. 9 is a top plan view of a circular embodiment of the invention.

FIG. 9 is a top plan view of a circular embodiment of the invention.

Figure 10:
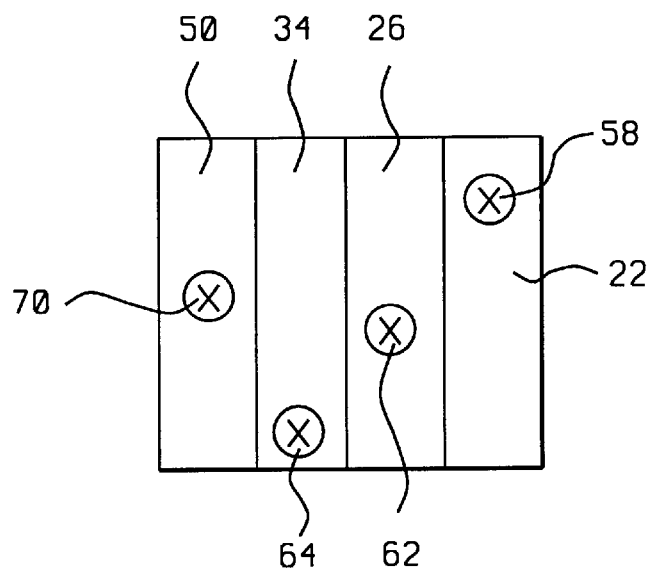
FIG. 10 is a top plan view of a planar embodiment of the invention.

FIG. 10 is a top plan view of a planar embodiment of the invention.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors as is known to those skilled in the art.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of vertical transistor; comprising the steps of:

a) forming a pad layer and a first insulating layer over a substrate;

b) forming a transistor opening through said pad layer and said first insulating layer;

c) forming a first conductive layer over said substrate in said transistor opening; said first conductive layer having a first conductivity type;

d) forming a first dielectric layer over portions of said first conductive layer and over said first insulating layer;

e) forming a second conductive layer over the exposed portions of said first conductive layer; said second conductive layer having a second conductivity type;

f) forming a second dielectric layer over portions of said second conductive layer and over said first insulating layer;

g) forming a third conductive layer over the exposed portions of said second conductive layer; said third conductive layer having a first conductivity type;

h) forming a third dielectric layer over said second dielectric layer and said third conductive layer;

i) forming a trench through said third conductive layer said third, second and first conductive layers to at least expose said substrate;

j) forming a gate dielectric layer on the sidewalls and bottom of said trench, k) forming a gate over said gate dielectric layer and filling said trench; and l) forming a cap dielectric layer over said third dielectric layer; and m) forming contacts through said first second and third dielectric layers to contact said first, second and third conductive layers.

2. The method of claim 1 wherein said pad layer is comprised of silicon oxide and said first insulating layer is comprised of silicon nitride having a thickness of between about 1000 and 5000 Å.

3. The method of claim 1 wherein said first dielectric layer is comprised of silicon oxide.

4. The method of claim 1 wherein said first conductive layer formed by a selective epitaxial process and said first conductive layer is comprised of silicon.

5. The method of claim 1 wherein said second conductive layer formed by a selective epitaxial process and said second conductive layer is comprised of silicon.

6. The method of claim 1 wherein said third conductive layer formed by a selective epitaxial process and said third conductive layer is comprised of silicon.

7. The method of claim 1 wherein said second dielectric layer is comprised of silicon oxide.

8. The method of claim 1 wherein said trench has a width of between about 0.2 μm and 2 μm.

9. The method of claim 1 wherein said gate dielectric layer is comprised of silicon oxide.

10. The method of claim 1 wherein said gate is comprised of polysilicon or tungsten (W).

11. The method of claim 1 wherein said gate formed by depositing a gate layer over filling said trench and over said third, second and first dielectric layers and chemical-mechanical polishing (CMP) said gate material layer.

12. A method of fabrication of vertical transistor; comprising the steps of:

a) forming a pad layer and an first insulating layer over a substrate;
   (1) said pad layer comprised of silicon oxide and said first insulating layer comprised of silicon nitride having a thickness of between about 1000 and 5000 Å;

b) forming a transistor opening through said pad layer and said first insulating layer;

c) forming a first conductive layer using a selective epitaxial process over said substrate in said transistor opening; said first conductive layer having a first conductivity type;

d) forming a first dielectric layer over portions of said first conductive layer and over said first insulating layer;
   (1) said first dielectric layer is comprised of silicon oxide;

e) forming a second conductive layer over the exposed portions of said first conductive layer; said second conductive layer having a second conductivity type;
   (1) said second conductive layer formed by a selective epitaxial process and said second conductive layer is comprised of silicon;

f) forming a second dielectric layer over portions of said second conductive layer and over said first insulating layer;
   (1) said second dielectric layer is comprised of silicon oxide;

g) forming a third conductive layer over the exposed portions of said second conductive layer using a selective epitaxial process; said third conductive layer having a first conductivity type;

h) forming a third dielectric layer (38) over said second dielectric layer and said third conductive layer;

i) forming a trench through said third conductive layer said third, second and first conductive layers to at least expose said substrate;
   (1) said trench has a width of between about 0.2 μm and 2.0 μm;

j) forming a gate dielectric layer on the sidewalls and bottom of said trench,
   (1) said gate dielectric layer is comprised of silicon oxide;

k) forming a gate over said gate dielectric layer and filling said trench;
   (1) said gate comprised of polysilicon or tungsten (W); said gate formed by depositing a gate layer over filling said trench and over said third, second and first dielectric layers and chemical-mechanical polishing (CMP) said gate material layer;

l) forming a cap dielectric layer over said third dielectric layer;

m) forming contacts through said cap dielectric, first, second, and third dielectric layers to contact said first, second and third conductive layers.

* * * * *